United States Patent [19]

Tsuchiya et al.

[11] Patent Number: 4,977,436
[45] Date of Patent: Dec. 11, 1990

[54] HIGH DENSITY DRAM

[75] Inventors: Kazuhisa Tsuchiya; Yoshio Enosawa; Motohiro Kitajima, all of Sendai, Japan

[73] Assignee: Motorola, Inc., Schaumburg, Ill.

[21] Appl. No.: 223,835

[22] Filed: Jul. 25, 1988

[51] Int. Cl.$^5$ .................... H01L 29/68; H01L 29/06; H01L 27/10

[52] U.S. Cl. .................... 357/236; 357/55; 357/45

[58] Field of Search ............ 357/23.6, 55, 45

[56] References Cited

U.S. PATENT DOCUMENTS

| | | |
|---|---|---|
| 4,737,829 | 4/1988 | Morimoto et al. ............ 357/23.6 |
| 4,769,786 | 9/1988 | Garnache et al. ............ 357/23.6 |

FOREIGN PATENT DOCUMENTS

| | | | |
|---|---|---|---|
| 198590 | 10/1986 | European Pat. Off. ............ 357/23.6 |
| 207054 | 9/1986 | Japan ............ 357/23.6 |
| 295654 | 12/1986 | Japan ............ 357/23.6 |

*Primary Examiner*—Rolf Hile
*Assistant Examiner*—Robert P. Limanek
*Attorney, Agent, or Firm*—John A. Fisher

[57] ABSTRACT

A high density DRAM having a plurality of cells each including a storage capacitor and a single control FET formed together in a trench to substantially reduce planar area of the cell. The FET drain is formed in the upper portion of a pedestal and is accessible externally through a metal line, which reduces line resistance and capacitance. Field oxide is included to isolate capacitors and reduce leakage and breakdown.

11 Claims, 5 Drawing Sheets

HIGH DENSITY DRAM

BACKGROUND OF THE INVENTION

The present invention pertains to dynamic random access memories (DRAMs) and more particularly to high density DRAMs. In the prior art, memory cells for DRAMs are constructed by forming trench capacitors in a substrate and using one or more planer transistors to connect the trench capacitors to an appropriate network of word and bit lines so as to form a memory. In these structures there are problems with "punch-through" between adjacent cells, leakage, parasitic transistors, noise, alpha particles, etc. Also, because of the planar transistors the cell size is drastically limited and as attempts to reduce the size of the planar transistors are increased, the problems become greater.

Some efforts have been made to place at least one of the controlling transistors in the trench. However, this produces high resistance, high capacitance lines and connections to the transistors and capacitors, which results in increased signal-to-noise and substantially reduces the speed of the memory. Further, these DRAMs can be extremely complicated and expensive to manufacture.

SUMMARY OF THE INVENTION

It is an object of the present invention to provide a new and improved high density DRAM.

It is a further object of the present invention to provide a new and improved high density DRAM including memory cells with substantially reduced size to increase the density thereof.

It is a further object of the present invention to provide a new and improved high density DRAM with improved signal-to-noise and speed.

It is a further object of the present invention to provide a new and improved high density DRAM which is less susceptible to "punchthrough", leakage and alpha particles.

It is a further object of the present invention to provide a new and improved high density DRAM which is relatively simple and inexpensive to manufacture.

These and other objects of this invention are realized in a high density DRAM including a semiconductor substrate having a plurality of spaced apart pedestals formed thereon and defining a plurality of trenches therebetween; material positioned in the trenches and forming a plurality of capacitors in conjunction with the plurality of pedestals; a plurality of field effect transistors (FETs) formed in the trenches, each having a gate electrode and a drain electrode, each of the transistors being formed in conjunction with one of the capacitors; first electrically conducting lines connecting selected ones of the drain electrodes; and second electrically conducting lines connecting selected ones of the gate electrodes.

Further, the objects of this invention are realized in an improved method of constructing a high density DRAM wherein the capacitors are formed in trenches between pedestals in a substrate and a control FET is formed in the trench in conjunction with each capacitor, a contact for the drain of each FET is formed in the upper surface of an adjacent pedestal and a low resistance material, such as a metal, is used to connect the drains into access lines, and an electrically insulating material is used in the bottom of the trenches to isolate capacitors and reduce "punchthrough" and leakage. The method is relatively simple because a single control FET is used in conjunction with each capacitor and because the capacitor and FET are formed in conjunction with each other.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
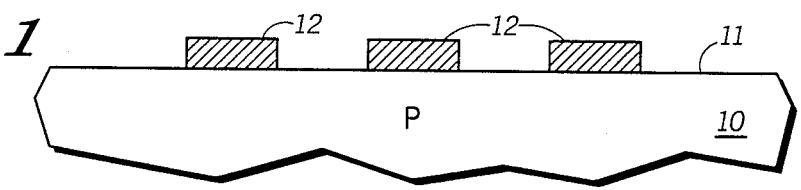
FIGS. 1 through 9 are sectional views illustrating various steps in the manufacture of a DRAM embodying the present invention.
Figure 2:
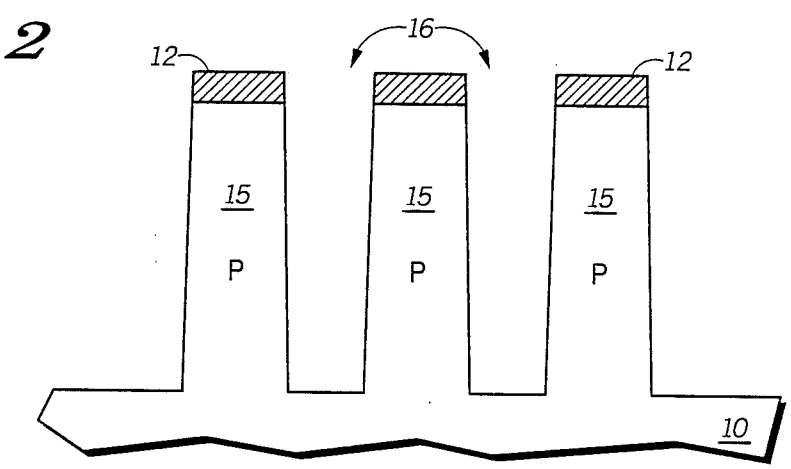

FIGS. 1-9 are sectional views illustrating various steps in the manufacture of a DRAM embodying the present invention. Referring specifically to FIG. 1, a semiconductor substrate 10 is illustrated, having a planar surface 11 with a mask 12 formed thereon. Masking is a well known art and will not be discussed herein. Mask 12 may be formed, for example, of silicon oxide or the like. Utilizing mask 12, substrate 10 is etched to form a plurality of spaced apart pedestals 15 defining channels 16 therebetween. Preferably, the sides of pedestals 15 are formed generally wedge shaped, rather than undercut, to facilitate further processing steps. Toward this end the present embodiment utilizes reactive ion etching to form channels 16 in substrate 10. Also, the depth of channels 16 from the surface 11 of substrate 10 is approximately five microns in this embodiment. It will of course be understood by those skilled in the art that the specific process steps and dimensions given for the present embodiment can be varied in accordance with the result desired and equipment available, and variations in specific process steps may result in or require variations in dimensions, or vice versa.

Figure 3:
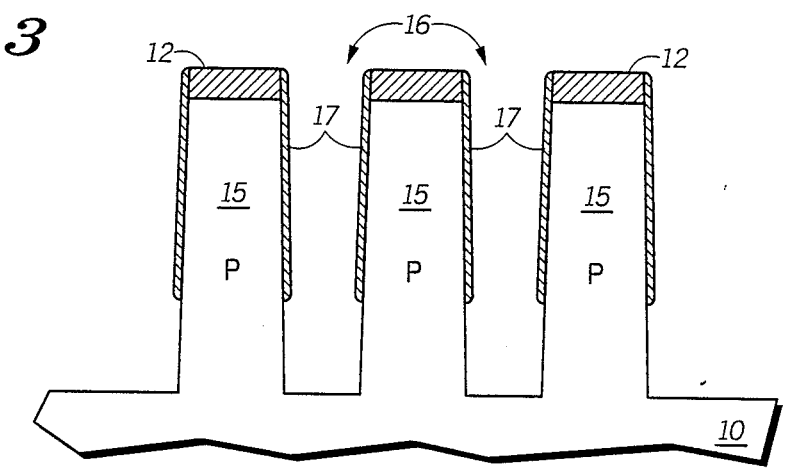
Figure 4:
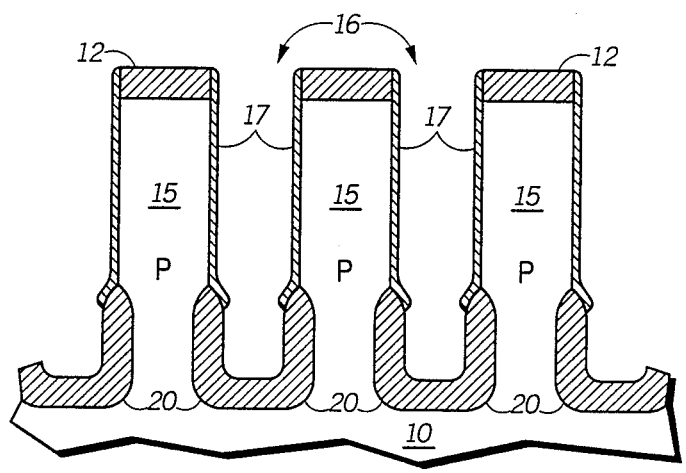
Figure 5:
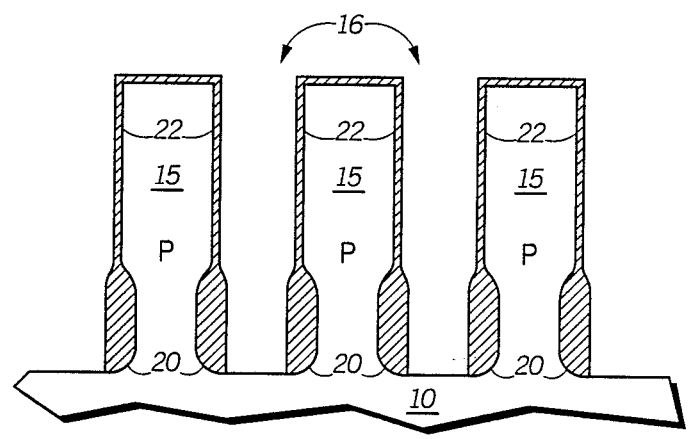

After etching channels 16 a masking layer 17, in this embodiment silicon nitride, is formed on the surfaces of channels 16. Masking layer 17 is removed from the bottom of channels 16 and approximately one and one-half to two microns of the sidewalls of pedestals 15. If the sidewalls of pedestals 15 are slightly wedge shaped, as illustrated in FIG. 3, masking layer 17 can be removed by reactive ion etching, for example. With the lower portion of the side walls of pedestals 15 unmasked, a relatively thick layer of field oxide 20 is formed in the bottoms of trenches 16 and the lower portions of the sidewalls of pedestals 15, as illustrated in FIG. 4. After the formation of field oxide 20, mask 12, masking layer 17 and portions of field oxide 20 on the bottoms of trenches 16 are removed by some convenient process, such as plasma etching or the like. A first relatively thin layer 22 of gate oxide is grown over the exposed surfaces of pedestals 15 as shown in FIG. 5. In this embodiment gate oxide layer 22 is approximately 200 angstroms thick.

Figure 6:
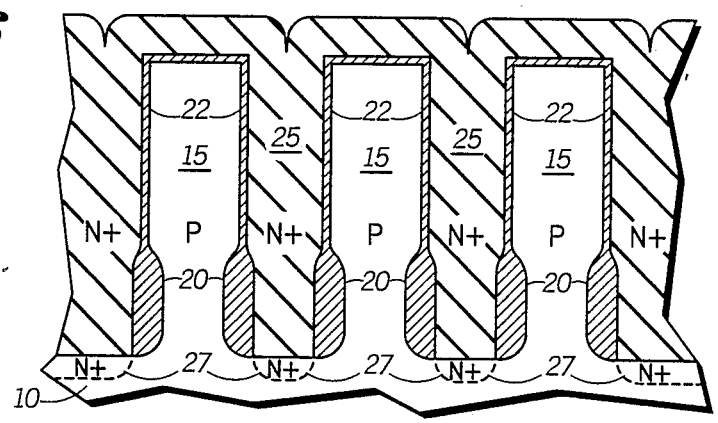

The channels 16 are now filled with a bulk layer 25 of lightly doped poly-silicon, as illustrated in FIG. 6. In this embodiment substrate 10 is a P type conductivity and bulk layer 25 is an N+ type conductivity. In addition, some of the dopant from bulk layer 25 is diffused into the bottoms of trenches 16 to form an N+ type conductivity area 27 in substrate 10 beneath each trench 16. The bulk layer 25 is etched, using a reactive ion etch, from the tops of pedestals 15 and to a predetermined depth, approximately one micron, into trenches 16. It will, of course, be understood that other methods of filling trenches 16 to the predetermined depth may be devised, e.g. stopping the poly-silicon deposition step earlier.

Figure 7:
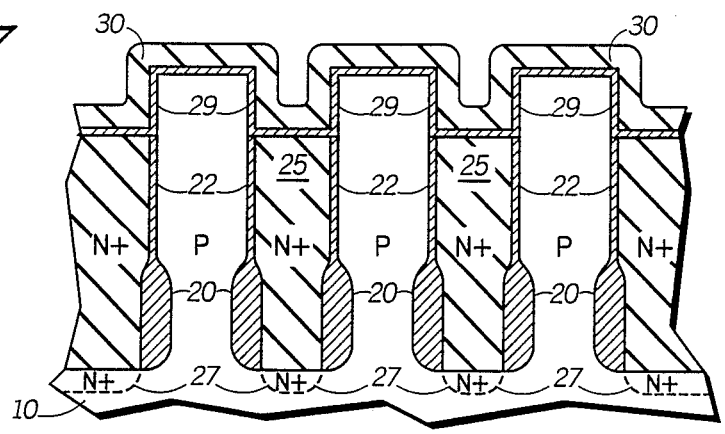
Figure 10:
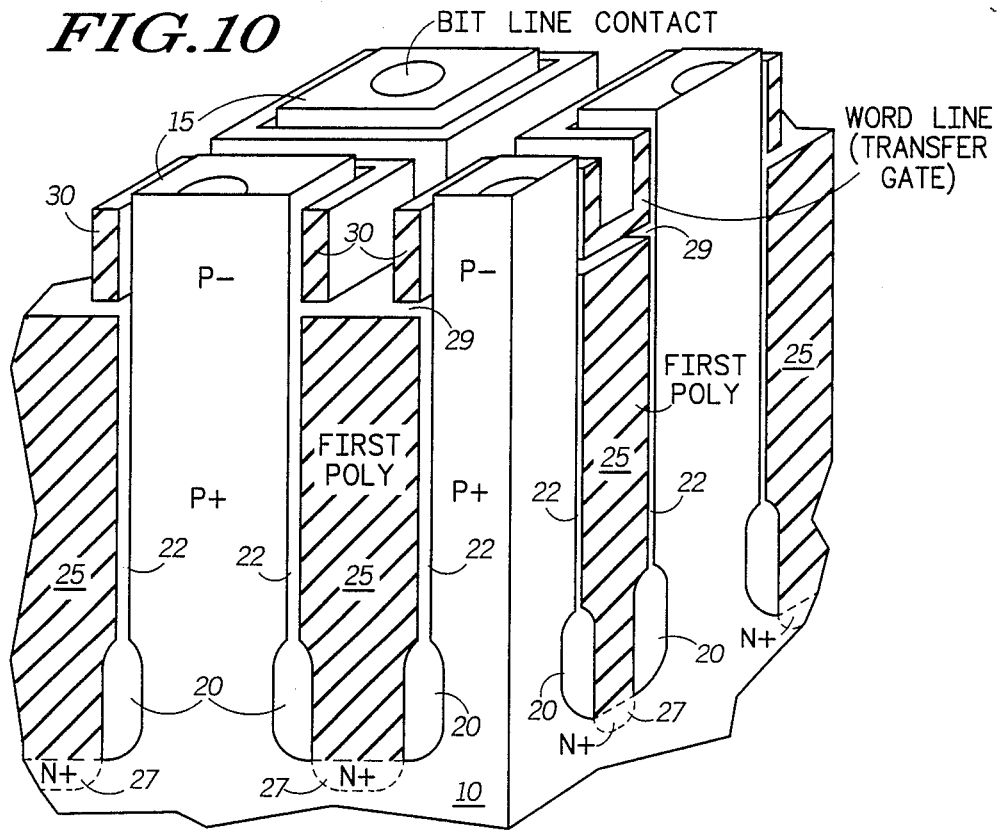
FIG. 10 is a view in prospective of a DRAM partially completed in accordance with the method illustrated in FIGS. 1-9, portions thereof broken away and shown in section.
Figure 11:
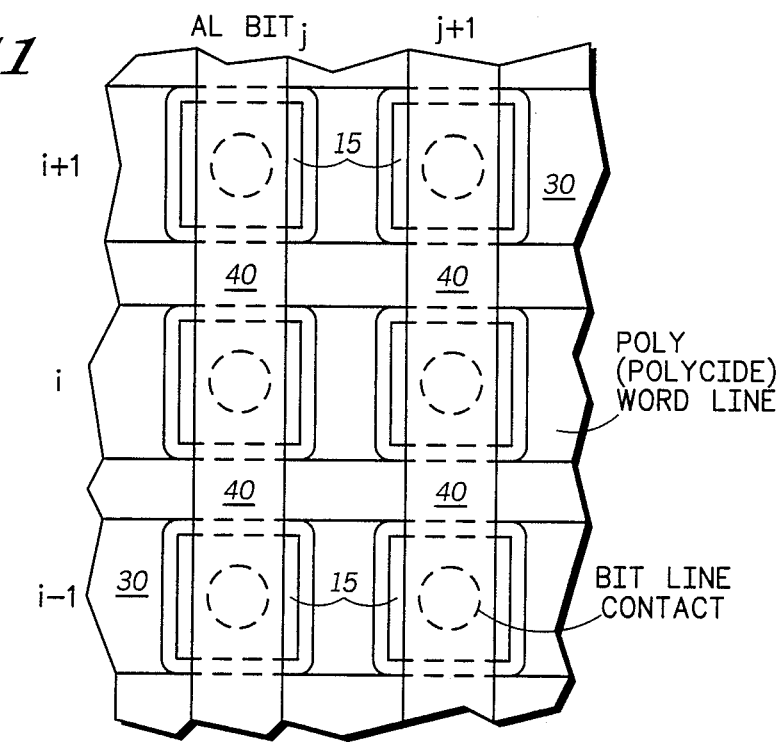
FIGS. 11 and 12 are views in top plan illustrating two different embodiments of DRAMs manufactured in accordance with the method illustrated in FIGS. 1-9.
Figure 12:
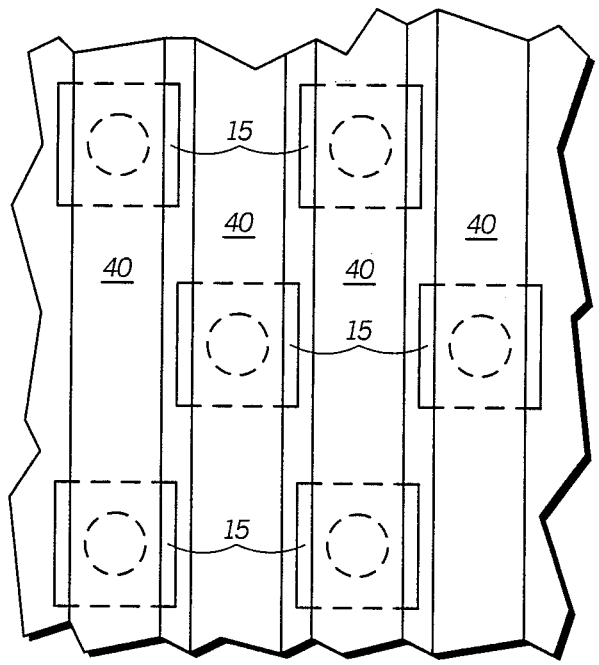

A second gate oxide layer 29, see FIG. 7, is grown on the surface of bulk layer 25 and on the sides of pedestals 15 if the removal of excess poly-silicon from bulk layer 25 also removed first gate oxide layer 22. A layer 30, approximately 3000 angstroms thick of relatively heavily doped poly-silicon, is deposited over the structure, as illustrated in FIG. 7. Layer 30 is etched, by reactive ion etching, to leave a generally ring shaped portion surrounding each pedestal 15 adjacent the upper end thereof and spaced from each pedestal 15 by gate oxide layer 29 (or 22). Also, layer 30 is spaced from bulk layer 25 by gate oxide layer 29. In addition to the above described etching of layer 30, the rings surrounding each pedestal 15 are separated from each other, except for predetermined ones. Generally, pedestals 15 will be formed in rows and columns on substrate 10. Then adjacent rings of layer 30 in each row will be connected while the rings in each column are separated. This specific embodiment is illustrated in prospective in FIG. 10. It will of course be understood that the standard open bit line illustrated in FIG. 11 may be used or the folded bit line illustrated in FIG. 12 may be used. The described selective etching of layer 30 to form rings surrounding pedestals 15 and lines between the rings may be accomplished by one or more steps of masking (photolithography) and reactive ion etching, by selective deposition of layer 30, or by combinations thereof.

Figure 8:
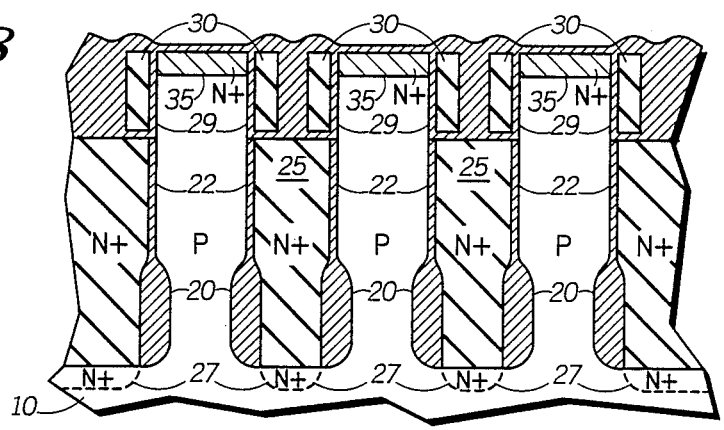
Figure 9:
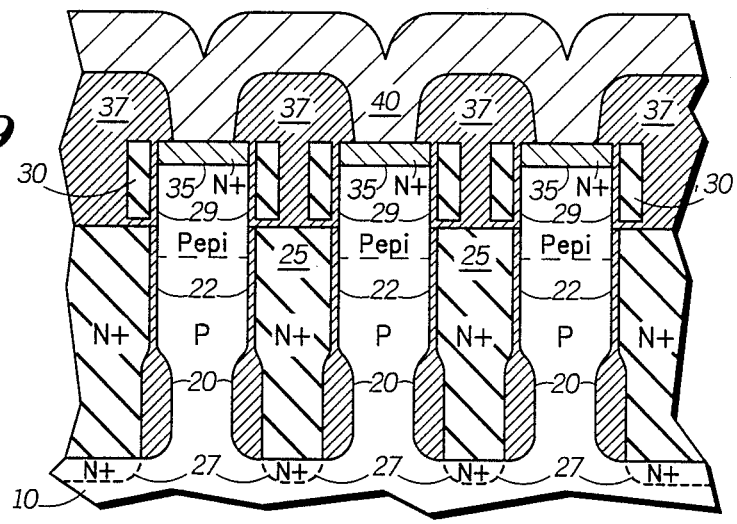

With the top surfaces of pedestals 15 exposed, an N+ diffusion layer 35 is formed in each pedestal 15 by the dual diffusion of P and As to a vertical depth of approximately 0.3 microns (see FIG. 8). Layer 35 forms the drain of a field effect transistor (FET). The ring formed from layer 30 surrounding the upper end of each pedestal 15 forms the gate of the FET. An electrically insulating isolation layer 37 is deposited in channels 16 to isolate the rings of layer 30 from each other. Any material on the tops of pedestals 15 is again removed to make clean contacts to the FET drains and connecting lines 40 are formed between preselected ones of the drains. In this embodiment, adjacent drains in each column are connected by lines 40. Since lines 40 are deposited on the surface of the finished DRAM and are in contact with substrate silicon (drains 35) the lines can be formed from a low resistance materials, such as metal or the like. Further, the low resistivity and position of the lines will result in very low capacitance. In this embodiment lines 40 are formed from aluminum, using conventional techniques of photolithography and sputtering.

Figure 13:
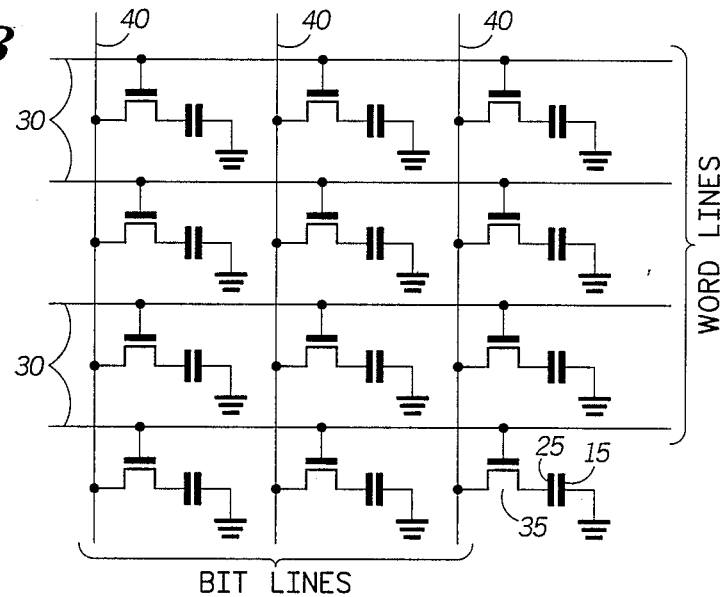
FIG. 13 is a schematic of a DRAM manufactured in accordance with the method illustrated in FIGS. 1-9.

Bulk layer 25 adjacent each pedestal 15 and separated from the sides of pedestal 15 by gate oxide layer 22, forms one plate of a storage capacitor. Pedestal 15 forms the other plate of the capacitor, which is connected directly to the substrate 10 (ground or some reference potential). Layer 35 at the top of each pedestal forms the drain of an FET. The ring formed from layer 30 surrounding the upper end of each pedestal 15 forms the gate of the FET. A virtual source for each FET is formed by a charge on layer 25. Thus, the structure can be illustrated schematically by an FET connected in series with a capacitor, as shown in FIG. 13. Also illustrated in FIG. 13 are the lines formed from layer 30 connecting selected ones of the gates and lines 40 connecting selected ones of the drains. From FIG. 13 it can be seen that the major portion of any electrical current, that is required to charge the storage capacitors, will be carried by lines 40. Since lines 40 are low resistance and low capacitance lines, the signal-to-noise and speed of the present DRAM will be significantly improved.

In the write operation of the DRAM illustrated, potentials to be stored are applied to one or more of the bit lines 40 and an activation signal is applied to one or more of the word lines 30. Each FET having a gate electrode connected to a word line 30 with an activation signal thereon is turned on, or activated. When an FET is activated, if a potential is applied to the line attached to the drain thereof, that potential is applied across the capacitor in series with the activated FET and stored therein. With all of the desired potentials written or stored in the DRAM, the read operation is as follows. A specific cell is addressed by connecting the proper output device to the bit line 40 connected to the drain of the cell to be read. An activation signal is then applied to the word line attached to the selected cell. Essentially, the stored potential in the capacitor acts like a power source and current is conducted in the opposite direction through the FET and through bit line 40 to the output device connected thereto. It should be noted that virtually no current is carried by word lines 30 so that the construction of these lines from heavily doped poly-silicon has little effect. All of the current required for the writing and reading of potentials in the DRAM are carried by bit lines 40, which are constructed of low resistance metal.

Each trench 16 includes a single piece of bulk layer 25 which acts as a capacitor plate in conjunction with pedestal 15 on each side thereof. Field oxide 20 at the bottoms of trenches 16 serves to isolate adjacent capacitors. Because bulk layer 25 is a lightly doped semiconductor, any charge on either (or both) capacitors in a single trench is confined to the surface area (adjacent gate oxide layer 22) of bulk layer 25. Field oxide 20 prevents the charge on one of the capacitors from extending along the surface of bulk layer 25 across the bottom of trench 16 and into the portion of bulk layer 25 that forms the other capacitor. Field oxide 20 also removes sharp corners and the like which have a tendency to cause "punchthrough" and other leakage problems.

When a field oxide is used in semiconductor structures there is a tendency for alpha particles (radiation) to produce minority carriers in the structure which can result in a breakdown of devices. Thus, the lightly doped area 27 is formed at the bottom of trenches 16, between adjacent areas of field oxide 20 to act as a carrier trap. Adverse effects of alpha particles is thereby substantially reduced. Also, it should be noted in FIG. 10 that an epitaxial layer has been formed on the upper surface of substrate 10. This may be incorporated in the process to implement the FET in an epitaxial CMOS technology, if desired. In this process the heavily doped substrate is used to reduce latch-up susceptibility and substrate noise. However, the capacitors in the present invention do not need to be limited in depth to the lighter doped epitaxial layer, as in prior art structures. Thus, the advantages of the epitaxial CMOS construction can be incorporated while making trenches 16 deep enough to provide the required capacitance.

Thus, an improved DRAM is disclosed which includes a single control FET positioned in a trench with the storage capacitor. This structure substantially reduces the planar area of each cell and, therefore, substantially improves the density of the DRAM. Further, the desired capacitance can be obtained without sacrificing FET size or characteristics. In addition, line resistance and capacitance are substantially reduced to obtain a DRAM with improved signal-to-noise and speed. Also, "punchthrough" and leakage have been substantially reduced by the incorporation of field oxide at the trench corners. Susceptibility to alpha particles has been virtually eleminated and, because of the simplified structure, manufacture of the present DRAM is relatively simple and inexpensive.

While we have shown and described specific embodiments of the present invention, further modifications and improvements will occur to those skilled in the art. We desire it to be understood, therefore, that this invention is not limited to the particular forms shown and we intend in the appended claims to cover all modifications which do not depart from the spirit and scope of this invention.

What I claim is:

1. A high density dynamic random access memory comprising:
    a semiconductor substrate having a plurality of spaced apart pedestals formed thereon and defining a plurality of trenches therebetween;
    semiconductor material positioned in the trenches and isolated from said pedestals by a capacitor dielectric to form a plurality of capacitors in conjunction with said plurality of pedestals, said semiconductor material electrically connected to said substrate;
    an insulating field oxide surrounding said pedestals proximate the bottom of said trench;
    a plurality of field effect transistors (FETs) formed in the trenches, each having a gate electrode, a drain electrode and a vertical source, each of said plurality of transistors being formed in conjunction with one of the plurality of capacitors;
    first electrically conducting lines connecting selected ones of the drain electrodes of the plurality of transistors; and
    second electrically conducting lines connecting selected ones of the gate electrodes of the plurality of transistors.

2. A high density dynamic random access memory as claimed in claim 1 wherein contacts for the drains of the plurality of transistors are formed, one each, on the upper surface of each of the pedestals.

3. A high density dynamic random access memory as claimed in claim 2 wherein the first lines connecting selected ones of the drain electrodes is formed of a relatively low resistance metal attached between contacts on the upper surfaces of the pedestals.

4. A high density dynamic random access memory as claimed in claim 1 wherein the substrate includes a lower, relatively heavily doped P+ type layer and an upper, lightly doped P− type layer.

5. A high density dynamic random access memory as claimed in claim 1 wherein the gate electrode of each of the FETs includes a layer of relatively heavily doped poly-silicon substantially surrounding a pedestal adjacent the upper end thereof and insulated from the pedestal by the thin layer of gate oxide on the sides of the pedestal, and the drain electrode of each of the FETs includes an N+ doped layer of silicon at the upper end of the pedestal.

6. A high density dynamic random access memory as claimed in claim 5 wherein the second line includes portions of the layer of relatively heavily doped poly-silicon extending between the selected ones of the gate electrodes.

7. A high density dynamic random access memory comprising:
    a semiconductor substrate;
    a plurality of pedestals of a first conductivity type formed on said substrate in spaced apart relationship to define a plurality of trenches therebetween;
    a second conductivity type layer positioned on each of said pedestals to form drain electrodes for a plurality of field effect transistors (FETs);
    a first gate layer of electrically insulating material formed on the sides of said pedestals in the trenches;
    a bulk layer of the second conductivity type semiconductor material positioned in the trenches, electrically connected to said substrate, and insulated from said pedestals by said first gate layer so as to form a capacitor in conjunction with each of said pedestals;
    a virtual source formed on the side of said pedestals for each of said FETs;
    a second gate layer of electrically insulating material formed on said bulk layer in the trenches and overlying a channel region extending from said drain electrode to said virtual source of each of said FETs;
    gate electrode material positioned in each of the trenches adjacent said second conductivity type layer and insulated from said pedestals, including said second conductivity type layer, by said first gate layer and insulated from said bulk layer by said second gate layer to form a plurality of gate electrodes, one gate electrode for each of the plurality of FETs;
    a relatively thick field oxide layer positioned on the sides of the pedestals adjacent the trench bottoms;
    first lines connecting selected ones of said plurality of drain electrodes; and
    second lines connecting selected ones of said plurality of gate electrodes.

8. A high density dynamic random access memory as claimed in claim 7 wherein the pedestals are integral with and a part of the substrate.

9. A high density dynamic random access memory as claimed in claim 7 wherein the gate electrode material is formed as a plurality of rings each extending substantially around one of the plurality of pedestals to form the gate electrode therewith.

10. A high density dynamic random access memory as claimed in claim 7 wherein the first lines are formed from a relatively low resistance material.

11. A high density dynamic random access memory as claimed in claim 10 wherein the gate electrode material is heavily doped poly-silicon and the second lines are formed of the gate electrode material extending between the selected gate electrodes.

* * * * *